United States Patent
Degai et al.

(10) Patent No.: US 11,562,905 B2
(45) Date of Patent: Jan. 24, 2023

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Motomu Degai, Toyama (JP); Hiroshi Ashihara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/818,865

(22) Filed: Mar. 13, 2020

(65) Prior Publication Data

US 2020/0219727 A1   Jul. 9, 2020

Related U.S. Application Data

(63) Continuation of application No. PCT/JP2017/035242, filed on Sep. 28, 2017.

(51) Int. Cl.
*H01L 21/223* (2006.01)
*H01L 21/02* (2006.01)
*H01L 21/285* (2006.01)

(52) U.S. Cl.
CPC ........ *H01L 21/223* (2013.01); *H01L 21/0215* (2013.01); *H01L 21/0217* (2013.01); *H01L 21/02129* (2013.01); *H01L 21/02153* (2013.01); *H01L 21/28562* (2013.01)

(58) Field of Classification Search
None
See application file for complete search history.

(56) References Cited

U.S. PATENT DOCUMENTS

| | | | |
|---|---|---|---|
| 6,180,469 B1* | 1/2001 | Pramanick | H01L 21/28052 257/E21.165 |
| 2001/0049979 A1* | 12/2001 | Zeller | B01D 39/2075 75/343 |
| 2005/0069641 A1* | 3/2005 | Matsuda | C23C 16/16 427/226 |
| 2010/0297846 A1 | 11/2010 | Kaga et al. | |
| 2013/0171767 A1* | 7/2013 | Moslehi | H01L 31/1864 438/89 |
| 2013/0237027 A1* | 9/2013 | Oh | H01L 29/66575 438/286 |

FOREIGN PATENT DOCUMENTS

| | | | |
|---|---|---|---|
| JP | H05-179425 A | 7/1993 | |
| JP | 2006295212 | * 10/2006 | ......... H01L 31/1804 |
| JP | 2011-006783 A | 1/2011 | |
| JP | 2012-199333 A | 10/2012 | |

OTHER PUBLICATIONS

Japanese Office Action dated Dec. 8, 2020 for Japanese Patent Application No. 2019-545496.
International Search Report and English Translation of PCT/JP2017/035242 dated Dec. 26, 2017, 4 pgs.

* cited by examiner

*Primary Examiner* — Alexander G Ghyka
(74) *Attorney, Agent, or Firm* — Volpe Koenig

(57) ABSTRACT

There is provided a technique that includes selectively doping a metal film with a dopant by performing: supplying a dopant-containing gas containing the dopant to a substrate in which the metal film and a film other than the metal film are formed on a film in which the dopant is doped; and removing the dopant-containing gas from above the substrate.

16 Claims, 7 Drawing Sheets

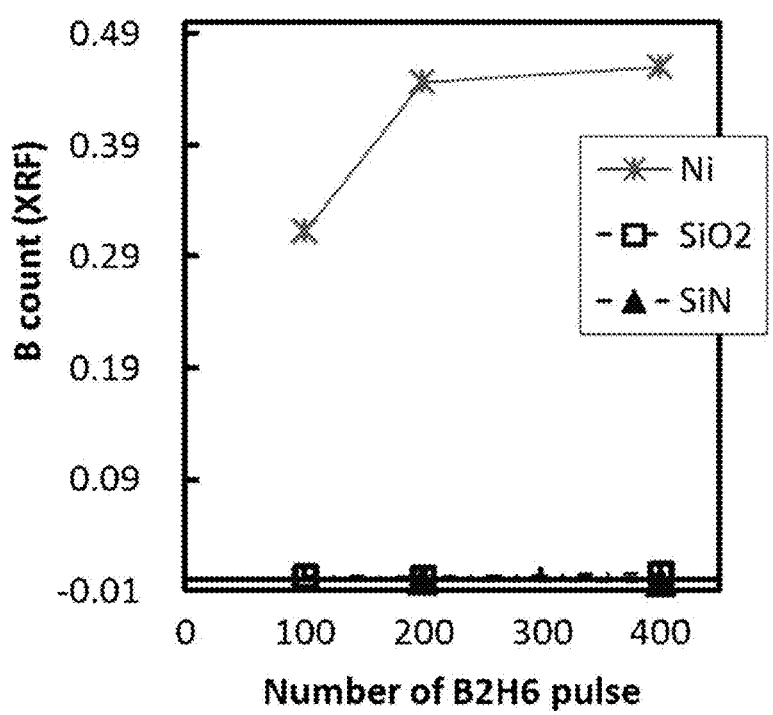

us 11,562,905 B2

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is a Bypass Continuation Application of PCT International Application No. PCT/JP2017/035242, filed on Sep. 28, 2017, the entire contents of which are incorporated herein by reference.

TECHNICAL FIELD

The present disclosure relates to a method of manufacturing a semiconductor device, a substrate processing apparatus, and a recording medium.

BACKGROUND

With the high integration and high performance of MOSFET (Metal Oxide Semiconductor Field Effect Transistor), various kinds of films are used for manufacture of MOSFETs.

For example, for a gate electrode of a MOSFET, there is a case where a metal film is formed on a silicon film in which impurities (dopants) are doped, and is annealed (thermally-treated), and the annealed metal film is used as metal silicide. In this case, out-diffusion of the impurities into the metal film from the silicon film doped with the impurities may occur, which may decrease the impurity concentration in the silicon film doped with the impurities.

SUMMARY

Some embodiments of the present disclosure provide a technique capable of suppressing diffusion of impurities from a silicon film doped with the impurities to a metal film formed on the silicon film.

According to one or more embodiments of the present disclosure, there is provided a technique that includes selectively doping a metal film with a dopant by performing: supplying a dopant-containing gas containing the dopant to a substrate in which the metal film and a film other than the metal film are formed on a film in which the dopant is doped; and removing the dopant-containing gas from above the substrate.

BRIEF DESCRIPTION OF DRAWINGS

FIG. 7 is a graph showing a change in the amount of B in each film with respect to the number of pulses of $B_2H_6$ gas according to the first embodiments of the present disclosure.

FIG. 8A is a cross-sectional view, and FIG. 8B is a view showing a result of analysis on a depth direction.

DETAILED DESCRIPTION

There is a case where a metal film, for example, a nickel (Ni) film, is formed on a B-doped Si film added (doped) with an impurity, for example, boron (B) and is annealed, and the annealed metal film is used as metal silicide such as nickel silicide (NiSi). In this case, B may diffuse from the B-doped Si film into the Ni film, which may decrease the B concentration in the B-doped Si film. For the purpose of preventing this diffusion, it is conceivable to dope the Ni film with B in advance.

Figure 1:
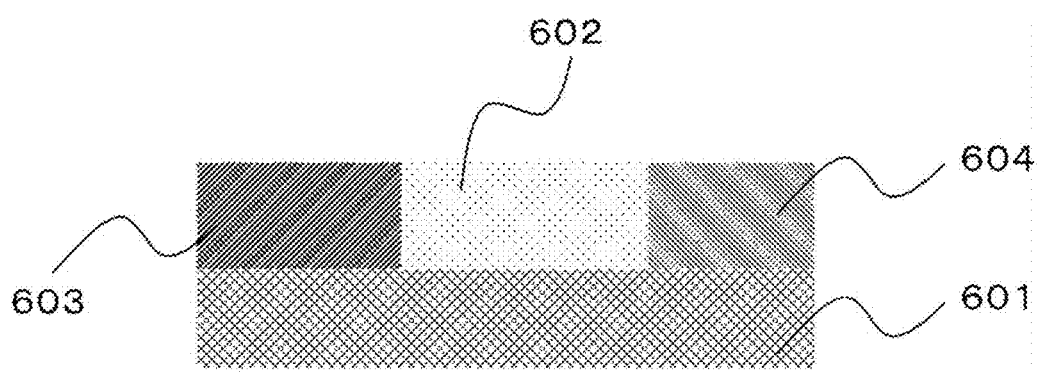
FIG. 1 illustrates an example of a structure to which the present disclosure is applied.

However, when B is doped into the Ni film, if B is doped into other peripheral films, the film quality is deteriorated (in the case of an insulating film, the insulating property is reduced). For example, as illustrated in FIG. 1, in a case where a Ni film 602 is formed on a B-doped Si film 601, and a silicon nitride film (SiN film) 603 and a silicon oxide film (SiO film) 604 are formed at a periphery of the Ni film 602, when the Ni film 602 is doped with B, the SiN film 603 and the SiO film 604 are also doped with B. Therefore, it is conceivable to prevent unwanted B doping by masking films other than the Ni film 602. However, forming a mask increases the number of steps.

Figure 2:
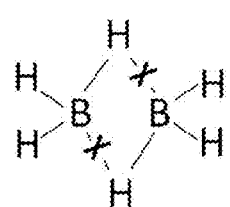
FIG. 2 is a view for explaining decomposition of a $B_2H_6$ gas according to the present disclosure using a structural formula.

As a result of intensive studies, the present inventors have found that selectively (preferentially) doping B (selective doping, selective dope or selective addition of B) only into the Ni film can suppress B-doping into a film other than the Ni film 602 without using a mask. Specifically, when the Ni film is irradiated (supplied) with a B-containing gas, for example, a diborane ($B_2H_6$) gas, Ni acts as a catalyst to decompose the $B_2H_6$ gas. That is, the electron donating property of the metal Ni promotes the decomposition of the $B_2H_6$ gas. Then, as illustrated in FIG. 2, a B—H bond is broken to form $BH_3$. Since $BH_3$ is unstable and highly reactive, B diffuses into Ni. In addition, since the coefficient of diffusion of B into Ni is large, B is easily introduced into Ni. On the other hand, since the SiN film and the SiO film are insulating films and have poor electron donating properties, there is no catalytic action of the metal Ni. Further, since the coefficient of diffusion of B into SiN or SiO is small, B is hardly introduced into SiN or SiO. Furthermore, for the SiO film, crystalline boron has acid resistance, and therefore, it may not be easily bonded to O. Therefore, B can be selectively added only to the Ni film. That is, it is possible to expose a gas containing B to a substrate on which Ni and other films are exposed, and dope only Ni with B. Details thereof will be described below.

First Embodiments of the Present Disclosure

Figure 3:
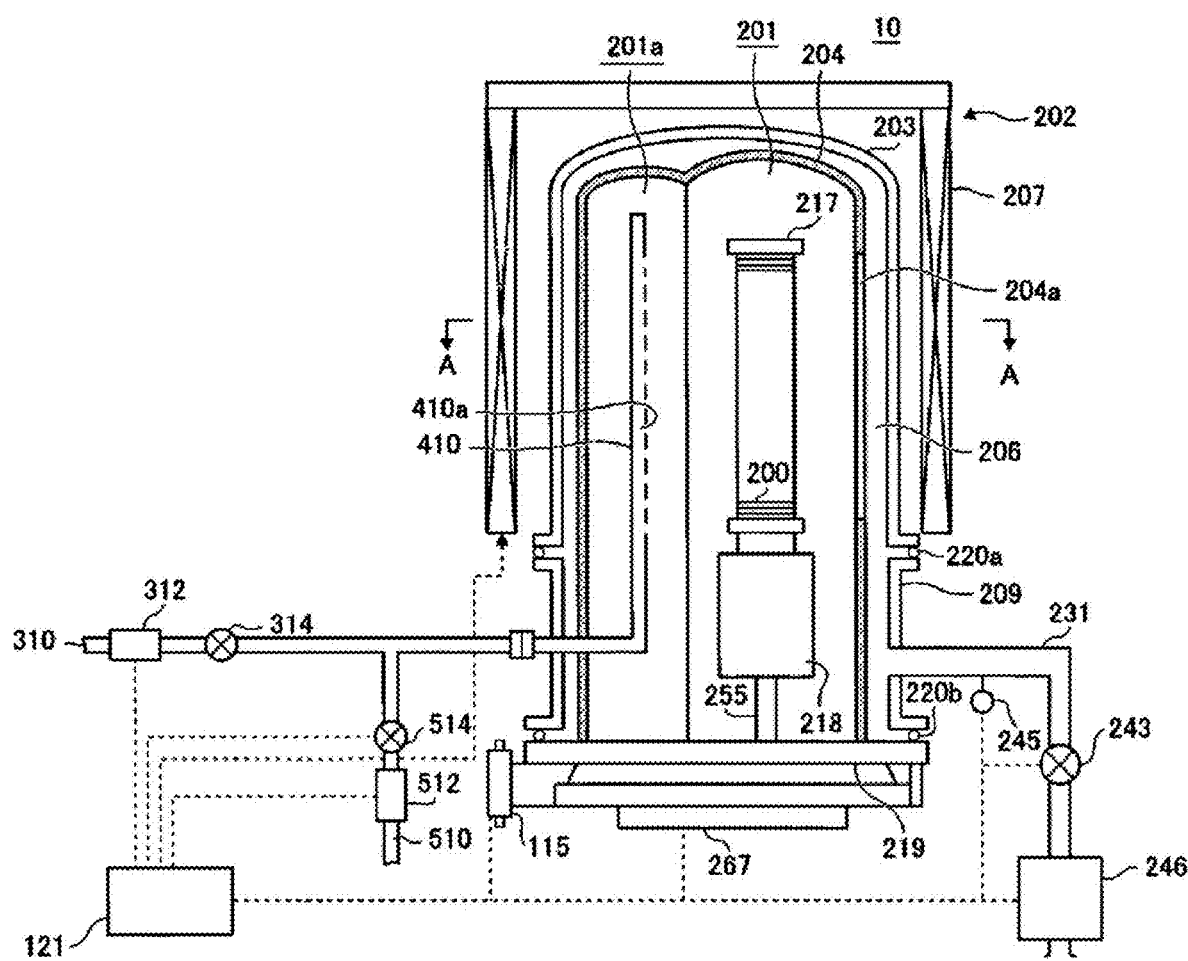
FIG. 3 is a schematic longitudinal sectional view illustrating a vertical process furnace of a substrate processing apparatus according to first embodiments of the present disclosure.

First embodiments of the present disclosure will now be described with reference to FIGS. 3 to 5. A substrate processing apparatus 10 is an example of an apparatus used for a semiconductor-device-manufacturing process.

(1) Configuration of Substrate Processing Apparatus

The substrate processing apparatus 10 includes a process furnace 202 provided with a heater 207 as a heating means (a heating mechanism or a heating system). The heater 207 has a cylindrical shape and is supported by a heat base (not shown) serving as a support plate so as to be vertically installed.

An outer tube 203 forming a reaction vessel (a process vessel) is disposed inside the heater 207 to be concentric with the heater 207. The outer tube 203 is made of, for example, a heat resistant material such as quartz ($SiO_2$), silicon carbide (SiC), or the like, and has a cylindrical shape with its upper end closed and its lower end opened. A manifold (inlet flange) 209 is disposed to be concentric with the outer tube 203 under the outer tube 203. The manifold 209 is made of, for example, a metal material such as stainless steel (SUS: Steel Use Stainless) or the like, and has a cylindrical shape with both of its upper and lower ends opened. An O-ring 220a serving as a seal member is installed between the upper end of the manifold 209 and the outer tube 203. As the manifold 209 is supported by the heater base, the outer tube 203 is in a state of being vertically installed.

An inner tube 204 forming the reaction vessel is disposed inside the outer tube 203. The inner tube 204 is made of, for example, a heat resistant material such as quartz ($SiO_2$), silicon carbide (SiC), or the like, and has a cylindrical shape with its upper end closed and its lower end opened. The process vessel (reaction vessel) mainly includes the outer tube 203, the inner tube 204, and the manifold 209. A process chamber 201 is formed in a hollow cylindrical portion (the inside of the inner tube 204) of the process vessel.

The process chamber 201 is configured to accommodate wafers 200 as substrates in a state where the wafers 200 are arranged in a horizontal posture and in multiple stages along a vertical direction by a boat 217 to be described below.

A nozzle 410 is installed in the process chamber 201 so as to penetrate through a sidewall of the manifold 209 and the inner tube 204. A gas supply pipe 310 as a gas supply line is connected to the nozzle 410. In this way, one nozzle 410 and one gas supply pipe 310 are installed at the substrate processing apparatus 10, thereby allowing a gas to be supplied into the process chamber 201. However, the process furnace 202 of the present embodiments is not limited to the above-described form.

A mass flow controller (MFC) 312, which is a flow rate controller (a flow rate control part), and a valve 314, which is an opening/closing valve, are installed to the gas supply pipe 310 sequentially from the upstream side. A gas supply pipe 510 for supplying an inert gas is connected to the gas supply pipe 310 at the downstream side of the valve 314. An MFC 512 which is a flow rate controller (a flow rate control part), and a valve 514, which is an opening/closing valve, are installed to the gas supply pipe 510 sequentially from the upstream side.

The nozzle 410 is connected to the leading end of the gas supply pipe 310. The nozzle 410 is configured as an L-shaped nozzle and its horizontal portion is installed to pass through the sidewall of the manifold 209 and the inner tube 204. The vertical portion of the nozzle 410 is installed inside a channel-shaped (groove-shaped) pre-chamber 201a formed to protrude radially outward of the inner tube 204 and extend in the vertical direction. The vertical portion of the nozzle 410 is installed upward (upward in the arrangement direction of the wafers 200) along the inner wall of the inner tube 204 in the pre-chamber 201a.

The nozzle 410 is installed so as to extend from a lower region of the process chamber 201 to an upper region of the process chamber 201, and a plurality of gas supply holes 410a are each formed at positions facing the wafers 200. Thus, a process gas is supplied to the wafers 200 from each of the gas supply holes 410a of the nozzle 410. The gas supply holes 410a are formed from a lower portion of the inner tube 204 to an upper portion thereof to have the same aperture area at the same aperture pitch. However, the gas supply holes 410a are not limited to the above-described form. For example, the aperture area may be gradually increased from the lower portion of the inner tube 204 to the upper portion thereof. This can make the flow rate of the gas supplied from the gas supply holes 410a more uniform.

The gas supply holes 410a of the nozzle 410 are installed at a position of the height from a lower portion of the boat 217 (which will be described below) to an upper portion thereof. Therefore, the process gas supplied into the process chamber 201 from the gas supply holes 410a of the nozzle 410 is supplied to the entire area of the wafers 200 accommodated from the lower portion of the boat 217 to the upper portion thereof, that is, the wafers 200 accommodated in the boat 217. The nozzle 410 may be installed so as to extend from the lower region of the process chamber 201 to the upper region thereof, but may be installed so as to extend near the ceiling of the boat 217.

A process gas, for example, a dopant-containing gas containing a dopant which is an impurity element, is supplied from the gas supply pipe 310 into the process chamber 201 via the MFC 312, the valve 314, and the nozzle 410. An example of the dopant-containing gas may include a B-containing gas containing boron (B, boron) as a dopant, specifically for example, a diborane ($B_2H_6$) gas (5%, diluted with $N_2$).

An inert gas, for example, a nitrogen ($N_2$) gas, is supplied from the gas supply pipe 510 into the process chamber 201 via the MFC 512, the valve 514, and the nozzle 410. In the following, an example in which the $N_2$ gas is used as the inert gas will be described. However, as the inert gas, in addition to the $N_2$ gas, it may be possible to use, e.g., a rare gas such as an argon (Ar) gas, a helium (He) gas, a neon (Ne) gas, a xenon (Xe) gas, or the like.

A process gas supply system mainly includes the gas supply pipe 310, the MFC 312, the valve 314, and the nozzle 410. However, the process gas supply system may include only the nozzle 410. The process gas supply system may be simply referred to as a gas supply system. When the dopant-containing gas is flowed from the gas supply pipe 310, a dopant-containing gas supply system mainly includes the gas supply pipe 310, the MFC 312, and the valve 314. However the dopant-containing gas supply system may include the nozzle 410. When the B-containing gas is used as the dopant-containing gas, the dopant-containing gas supply system may be referred to as a B-containing gas supply system. When the $B_2H_6$ gas is used as the B-containing gas, the B-containing gas supply system may be referred to as a $B_2H_6$ gas supply system. An inert gas supply system mainly includes the gas supply pipe 510, the MFC 512, and the valve 514. The inert gas supply system may be referred to as a purge gas supply system, a dilution gas supply system, or a carrier gas supply system.

A gas-supplying method according to the present embodiments is to transfer a gas via the nozzle 410 disposed in the pre-chamber 201a in an elongated annular space defined by the inner wall of the inner tube 204 and the ends of the plurality of wafers 200, that is, in a cylindrical space. Then, the gas is ejected into the inner tube 204 from the plurality of gas supply holes 410a installed at positions of the nozzle 410 facing the wafers. More specifically, the dopant-containing gas or the like is ejected through the gas supply holes 410a of the nozzle 410 in a direction parallel to the surfaces of the wafers 200, that is, in a horizontal direction.

An exhaust hole (an exhaust port) 204a is a through-hole formed at a position facing the nozzle 410 on the side wall of the inner tube 204, that is, at a position 180 degrees opposite to the pre-chamber 201a. The exhaust hole 204a is, for example, a slit-shaped through-hole elongated in the vertical direction. Therefore, a gas supplied into the process chamber 201 from the gas supply holes 410a of the nozzle 410 and flowing on the surfaces of the wafers 200, that is, a remaining gas (a residual gas), flows into an exhaust path 206 formed by a gap formed between the inner tube 204 and the outer tube 203 through the exhaust hole 204a. Then, the gas flowing into the exhaust path 206 flows into an exhaust pipe 231 and is discharged out of the process furnace 202.

The exhaust hole 204a is formed at a position facing the plurality of wafers 200 (preferably at a position facing the lower portion of the boat 217 from the upper portion thereof). Therefore, a gas supplied from the gas supply hole 410a to the vicinity of the wafers 200 in the process chamber 201 flows in a horizontal direction, that is, in a direction parallel to the surfaces of the wafers 200, and then flows into the exhaust path 206 through the exhaust hole 204a. That is, the gas remaining in the process chamber 201 is exhausted in parallel with the main surfaces of the wafers 200 through the exhaust hole 204a. The exhaust hole 204a is not limited to the case where it is configured as a slit-shaped through-hole, but may be configured with a plurality of holes.

The exhaust pipe 231 for exhausting an internal atmosphere of the process chamber 201 is installed at the manifold 209. A pressure sensor 245, which is a pressure detector (pressure detecting part) for detecting an internal pressure of the process chamber 201, an APC (auto pressure controller) valve 243 and a vacuum pump 246 as a vacuum-exhausting device are connected to the exhaust pipe 231 sequentially from the upstream side. The APC valve 243 is configured to perform or stop a vacuum-exhausting operation in the process chamber 201 by opening or closing the valve while the vacuum pump 246 is actuated, and is also configured to adjust the internal pressure of the process chamber 201 by adjusting an opening degree of the valve while the vacuum pump 246 is actuated. An exhaust system or an exhaust line mainly includes the exhaust hole 204a, the exhaust path 206, the exhaust pipe 231, the APC valve 243, and the pressure sensor 245. The exhaust system may include the vacuum pump 246.

A seal cap 219, which serves as a furnace opening cover configured to hermetically seal a lower end opening of the manifold 209, is installed under the manifold 209. The seal cap 219 is configured to contact the lower end of the manifold 209 from the lower side in the vertical direction. The seal cap 219 is made of, for example, a metal material such as stainless steel (SUS) or the like, and is formed in a disc shape. An O-ring 220b, which is a seal member making contact with the lower end of the manifold 209, is installed at an upper surface of the seal cap 219. A rotation mechanism 267 configured to rotate the boat 217 that accommodates wafers 200 is installed at the opposite side of the seal cap 219 from the process chamber 201. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevating mechanism vertically installed outside the outer tube 203. The boat elevator 115 is configured so as to load/unload the boat 217 into/out of the process chamber 201 by moving the seal cap 219 up and down. The boat elevator 115 is configured as a transfer device (transfer mechanism) which transfers the boat 217 and the wafers 200 accommodated in the boat 217, into/out of the process chamber 201.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat-insulating plates 218 made of a heat resistant material such as quartz or SiC are supported in a horizontal posture and in multiple stages (not shown) below the boat 217. This configuration makes it difficult for heat from the heater 207 to be transferred to the seal cap 219. However, the present embodiments are not limited to the above-described form. For example, instead of installing the heat-insulating plates 218 below the boat 217, a heat-insulating tube configured as a cylindrical member made of a heat resistant material such as quartz or SiC may be installed.

Figure 4:
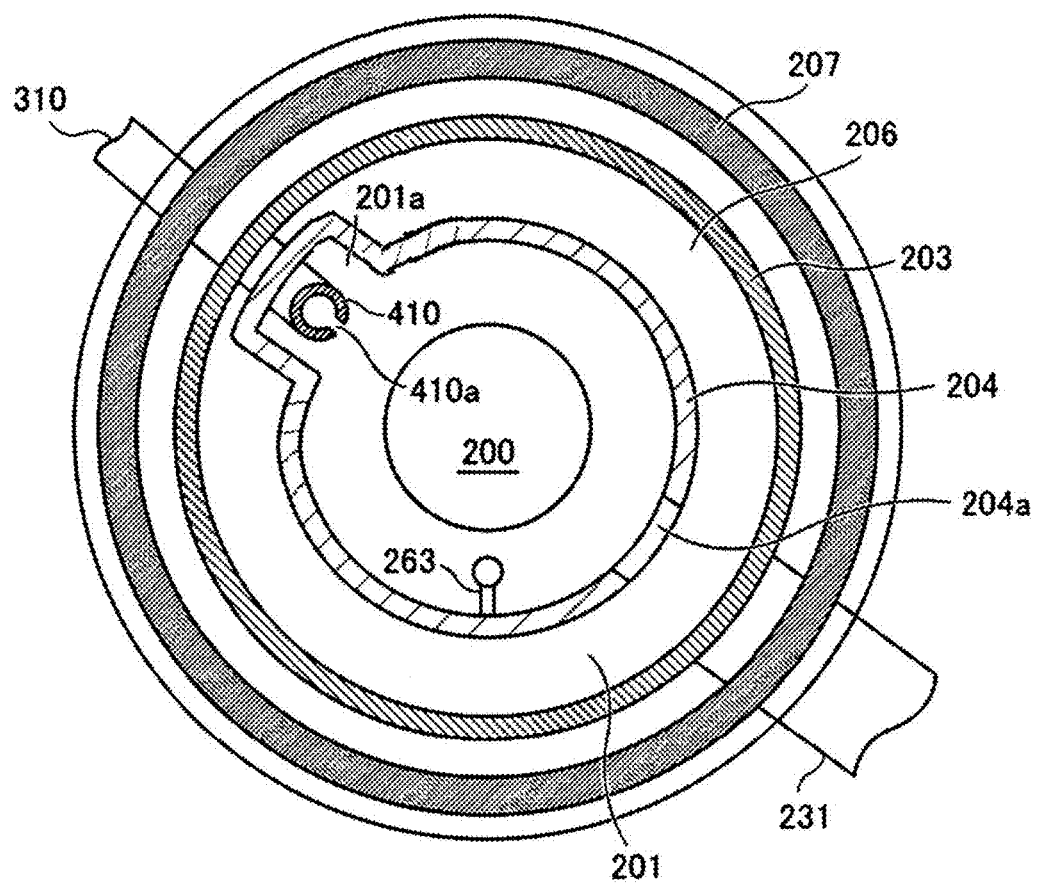
FIG. 4 is a schematic cross-sectional view taken along line A-A in FIG. 1.

As illustrated in FIG. 4, a temperature sensor 263 serving as a temperature detector is installed in the inner tube 204. Based on temperature information detected by the temperature sensor 263, a state of supplying electric power to the heater 207 is adjusted such that the interior of the process chamber 201 has a desired temperature distribution. The temperature sensor 263 has an L-shape and is installed along the inner wall of the inner tube 204 in the same manner as the nozzle 410.

Figure 5:
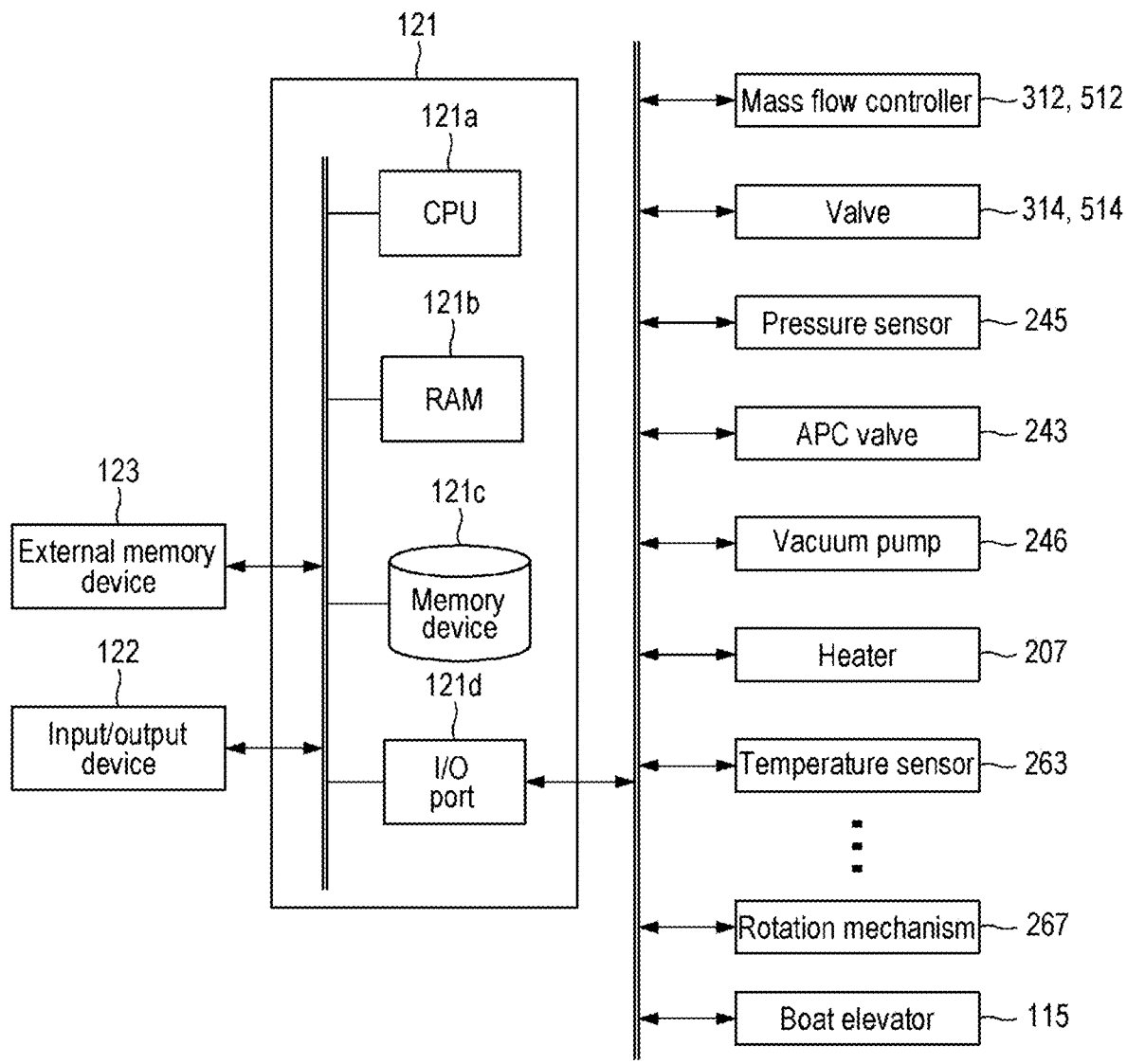
FIG. 5 is a schematic configuration diagram of a controller of the substrate processing apparatus according to the first embodiments of the present disclosure, in which a control system of the controller is illustrated in a block diagram.

As illustrated in FIG. 5, a controller 121, which is a control part (control means), may be configured as a computer including a CPU (central processing unit) 121a, a RAM (random access memory) 121b, a memory device 121c, and an I/O port 121d. The RAM 121b, the memory device 121c, and the I/O port 121d are configured to exchange data with the CPU 121a via an internal bus. An input/output device 122 formed of, e.g., a touch panel or the like, is connected to the controller 121.

The memory device 121c is configured by, for example, a flash memory, a HDD (hard disk drive), or the like. A control program for controlling operations of a substrate processing apparatus and a process recipe, in which sequences and conditions of a semiconductor-device-manufacturing method to be described below are written, are readably stored in the memory device 121c. The process recipe functions as a program for causing the controller 121 to execute various steps in the semiconductor-device-manufacturing method to be described below, to obtain an expected result. Hereinafter, the process recipe and the control program may be generally and simply referred to as a "program." When the term "program" is used herein, it may indicate a case of including the process recipe only, a case of including the control program only, or a case of including both the process recipe and the control program. The RAM 121b is configured as a memory area (work area) in which a program or data read by the CPU 121a is temporarily stored.

The I/O port 121d is connected to the MFCs 312 and 512, the valves 314 and 514, the pressure sensor 245, the APC valve 243, the vacuum pump 246, the heater 207, the temperature sensor 263, the rotation mechanism 267, the boat elevator 115, and so on.

The CPU 121a is configured to read and execute the control program from the memory device 121c. The CPU 121a is also configured to read the recipe from the memory device 121c according to an input of an operation command from the input/output device 122. The CPU 121a is configured to control the flow-rate-adjusting operation of various kinds of gases by the MFCs 312 and 512, the opening/closing operation of the valves 314 and 514, the opening/closing operation of the APC valve 243, the pressure-adjusting operation performed by the APC valve 243 based on the pressure sensor 245, the temperature-adjusting operation of heater 207 based on the temperature sensor 263, the actuating and stopping of the vacuum pump 246, the rotation and rotation-speed-adjusting operation of the boat 217 by the rotation mechanism 267, the moving up/down operation of the boat 217 by the boat elevator 115, the accommodating operation of the wafers 200 in the boat 217, and the like, according to contents of the read recipe.

The controller 121 may be configured by installing, on the computer, the aforementioned program stored in an external memory device 123 (for example, a magnetic tape, a magnetic disk such as a flexible disk or a hard disk, an optical disc such as a CD or a DVD, a magneto-optical disc such as a MO, a semiconductor memory such as a USB memory or a memory card, etc.). The memory device 121c or the external memory device 123 is configured as a non-transitory computer-readable recording medium. Hereinafter, the memory device 121c and the external memory device 123 may be generally and simply referred to as a "recording medium." When the term "recording medium" is used herein, it may indicate a case of including the memory device 121c only, a case of including the external memory device 123 only, or a case of including both the memory device 121c and the external memory device 123. Furthermore, the program may be provided to the computer using a communication means such as the Internet or a dedicated line, instead of using the external memory device 123.

(2) Substrate-Processing Process (Film-Forming Step)

Figure 6:
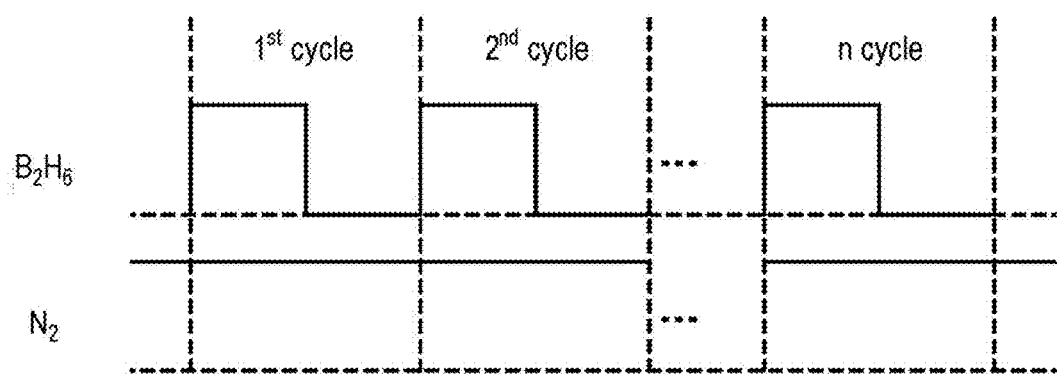
FIG. 6 is a diagram showing gas supply timings according to the first embodiments of the present disclosure.

As one step of a process of manufacturing a semiconductor device, an example of a step of selectively doping a Ni film of a wafer 200 with B in which the Ni film and a film (for example, a SiN film or a SiO film) other than the Ni film are formed on a film in which B is doped (a B-doped Si film) will be described with reference to FIG. 6. The step of selectively doping the Ni film with B is performed using the process furnace 202 of the above-described substrate processing apparatus 10. In the following description, the operations of various parts constituting the substrate processing apparatus 10 are controlled by the controller 121.

A substrate-processing process (a semiconductor-device-manufacturing process) according to the present embodiments includes selectively doping a metal film (Ni film) with a dopant (B) by performing: a step of supplying a dopant-containing gas ($B_2H_6$ gas) containing the dopant (B) to a wafer 200 in which the metal film (Ni film) and a film (for example, SiN film or SiO film) other than the metal film (Ni film) are formed on a film in which the dopant (B) is doped (B-doped Si film); and a step of removing the dopant-containing gas ($B_2H_6$ gas) from above the wafer 200.

When the term "wafer" is used in the present disclosure, it may refer to "a wafer itself" or "a wafer and a laminated body (aggregated body) of certain layers or films formed on a surface of the wafer." (In other words, the term "wafer" may be referred to including a certain layer or film formed on the surface of the wafer.) When the phrase "a surface of a wafer" is used in the present disclosure, it may refer to "a surface (exposed surface) of a wafer itself" or "a surface of a certain layer or film formed on a wafer, that is, the outermost surface of the wafer as a laminated body". When the term "substrate" is used in the present disclosure, it may be synonymous with the term "wafer."

(Wafer Loading)

When a plurality of wafers 200 in each of which a Ni film and a film (for example, a SiN film or a SiO film) other than the Ni film are formed on a B-doped Si film are charged on the boat 217 (wafer charging), the boat 217 supporting the plurality of wafers 200 is lifted up by the boat elevator 115 to be loaded into the process chamber 201 (boat loading). In this state, the seal cap 219 seals the lower end opening of the outer tube 203 via the O-ring 220.

(Pressure Adjustment and Temperature Adjustment)

The interior of the process chamber 201 is vacuum-exhausted by the vacuum pump 246 so as to reach a desired pressure (degree of vacuum). In this operation, the internal pressure of the process chamber 201 is measured by the pressure sensor 245. The APC valve 243 is feedback-controlled based on the measured pressure information (pressure adjustment). The vacuum pump 246 keeps operating at all times at least until a process to the wafers 200 is completed. In addition, the interior of the process chamber 201 is heated by the heater 207 to a desired temperature. In this operation, the state of supplying electric power to the heater 207 is feedback-controlled based on the temperature information detected by the temperature sensor 263 (temperature adjustment) such that the interior of the process chamber 201 has a desired temperature distribution. The heating of the interior of the process chamber 201 by the heater 207 is continuously performed at least until the process to the wafer 200 is completed.

Subsequently, a step of selectively doping the Ni film of the wafer 200 with B is performed. Hereinafter, a $B_2H_6$ gas is intermittently (pulsingly) supplied to the wafer 200 (pulse supply).

($B_2H_6$-Gas-Supplying Step)

The valve 314 is opened to allow a $B_2H_6$ gas, which is a dopant-containing gas, to flow into the gas supply pipe 310. A flow rate of the $B_2H_6$ gas is adjusted by the MFC 312, and then the $B_2H_6$ gas is supplied from the gas supply holes 410a the nozzle 410 into the process chamber 201 and is exhausted through the exhaust pipe 231. In this operation, the $B_2H_6$ gas is supplied to the wafer 200. At the same time, the valve 514 may be opened to allow an inert gas such as a $N_2$ gas to flow into the gas supply pipe 510. A flow rate of the $N_2$ gas that is flowed into the gas supply pipe 510 is adjusted by the MFC 512, and the $N_2$ gas is supplied into the process chamber 201 together with the $B_2H_6$ gas and is exhausted through the exhaust pipe 231.

At this time, the APC valve 243 is adjusted so that the internal pressure of the process chamber 201 falls within a range of, for example, 40 to 1,000 Pa. If the internal pressure is lower than 40 Pa, the concentration of B, which is deposited on the surface of the wafer 200 as the $B_2H_6$ gas is decomposed, decreases. Although the penetration of B into Ni is due to a diffusion effect, a diffusion speed is proportional to a concentration gradient. Therefore, if the B concentration is low, a speed at which B penetrates into Ni may be significantly reduced. If the internal pressure is higher than 1,000 Pa, collision between $B_2H_6$ gas molecules in the gas phase frequently occurs, thereby decomposing the $B_2H_6$ gas. However, the selectivity of B doping is caused by the fact that the $B_2H_6$ gas is decomposed on the Ni surface but is not decomposed on the SiO or SiN surface. Therefore, when the $B_2H_6$ gas is decomposed in the gas phase reaction, $BH_3$, which is a decomposition product, is supplied to any of the Ni, SiO, SiN, and the like, which may deteriorate the selectivity.

A supply flow rate of the $B_2H_6$ gas, which is controlled by the MFC 312, is set to fall within a range of, e.g., 0.3 to 1.0 slm. When the flow rate is smaller than 0.3 slm, a flow velocity of the $B_2H_6$ gas becomes low, and accordingly the $B_2H_6$ gas easily stays on the surface and is easily physically adsorbed on the surface. When the physical adsorption density increases, the $B_2H_6$ gas is easily thermally decomposed. Since this decomposition occurs regardless of the type of a film, it can also occur on the surface of the SiO film or SiN film, which may deteriorate the selectivity of B doping. The time for which the $B_2H_6$ gas is supplied to the wafer 200 is set to fall within a range of, e.g., 8 to 12 seconds.

At this time, the temperature of the heater 207 is set such that the temperature of the wafer 200 falls within a range of, e.g., 100 to 300 degrees C., specifically 160 to 220 degrees C. If the temperature is lower than 100 degrees C., the decomposition reaction of the $B_2H_6$ gas by the catalytic action of Ni requires activation energy and accordingly may not occur. In addition, if the temperature is lower than 100 degrees C., since the diffusion of B in Ni becomes slow or hardly occurs, B may not penetrate into Ni or it may take a very long time for B to penetrate into Ni. If the temperature is higher than 300 degrees C., since the $B_2H_6$ gas is self-(thermally) decomposed, the selectivity may be broken and B may penetrate into or be deposited on the SiN film or the SiO film. At this time, only the $B_2H_6$ gas and the $N_2$ gas are flowed into the process chamber 201 and B is added to the Ni film formed on the surface of the wafer 200 by the supply of the $B_2H_6$ gas.

(Residual-Gas-Removing Step)

After B is added to the Ni film, the valve 314 is closed to stop the supply of the $B_2H_6$ gas. At this time, with the APC valve 243 of the exhaust pipe 231 kept open, the interior of the process chamber 201 is vacuum-exhausted by the vacuum pump 246 to remove the unreacted $B_2H_6$ gas remaining in the process chamber 201 or the $B_2H_6$ gas contributed to the addition of B, from the process chamber 201. At this time, with the valve 514 kept open, the supply of the $N_2$ gas into the process chamber 201 is maintained. The $N_2$ gas can act as a purge gas to enhance the effect of removing the unreacted $B_2H_6$ gas remaining in the process chamber 201 or the $B_2H_6$ gas contributed to the addition of B, from the process chamber 201.

(Performing Predetermined Number of Times)

When a cycle that performs the above-described $B_2H_6$-gas-supplying step and residual-gas-removing step sequentially is performed once or more (a predetermined number of times (n times)), B is added up to a predetermined depth (for example, 4 to 5 nm) in the Ni film on the wafer 200 to form a B-doped Ni film. The addition of B is the diffusion of B into the Ni film, which is saturated up to the above-mentioned depth and is not added to a further depth. The above cycle is preferably repeated multiple times.

(After-Purge and Returning to Atmospheric Pressure)

A $N_2$ gas is supplied into the process chamber 201 from the gas supply pipe 510 and is exhausted through the exhaust pipe 231. The $N_2$ gas acts as a purge gas, whereby the interior of the process chamber 201 is purged with an inert gas, and gases and by-products remaining in the process chamber 201 are removed from the interior of the process chamber 201 (after-purge). Thereafter, the internal atmosphere of the process chamber 201 is substituted with an inert gas (inert gas substitution), and the internal pressure of the process chamber 201 is returned to the normal pressure (returning to atmospheric pressure).

(Wafer Unloading)

Thereafter, the seal cap 219 is moved down by the boat elevator 115 to open the lower end of the outer tube 203. Then, the processed wafers 200 supported by the boat 217 are unloaded from the lower end of the outer tube 203 to the outside of the outer tube 203 (boat unloading). Thereafter, the processed wafers 200 are discharged from the boat 217 (wafer discharging).

FIG. 7 shows a XPF (X-ray Photoelectron Spectroscopy) spectrum when the above-described $B_2H_6$-gas-supplying step and residual-gas-removing step are sequentially repeated 400 times (n=400). FIG. 7 shows the amount of B (B count (XRF)) in each film with respect to the number of pulses of $B_2H_6$ gas (Number of $B_2H_6$ pulse). It can be seen from FIG. 7 that B is added to the Ni film, whereas B is not added to the SiO film ($SiO_2$ film) and the SiN film. It can also be seen that the amount of B added to the Ni film decreases and become saturated as the number of $B_2H_6$ pulses increases.

Figure 8A:
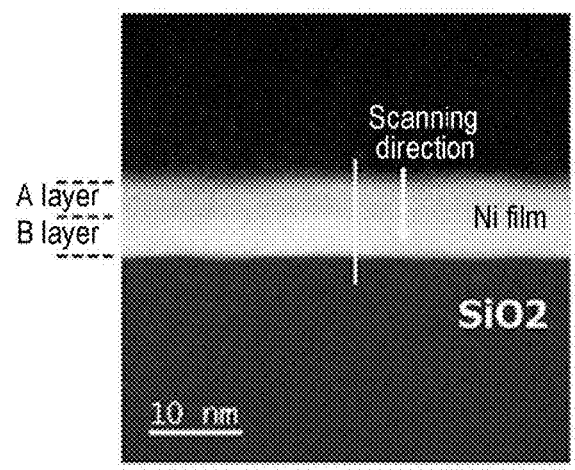
FIGS. 8A and 8B show an experimental result of TEM-EELS according to the first embodiments of the present disclosure.
Figure 8B:
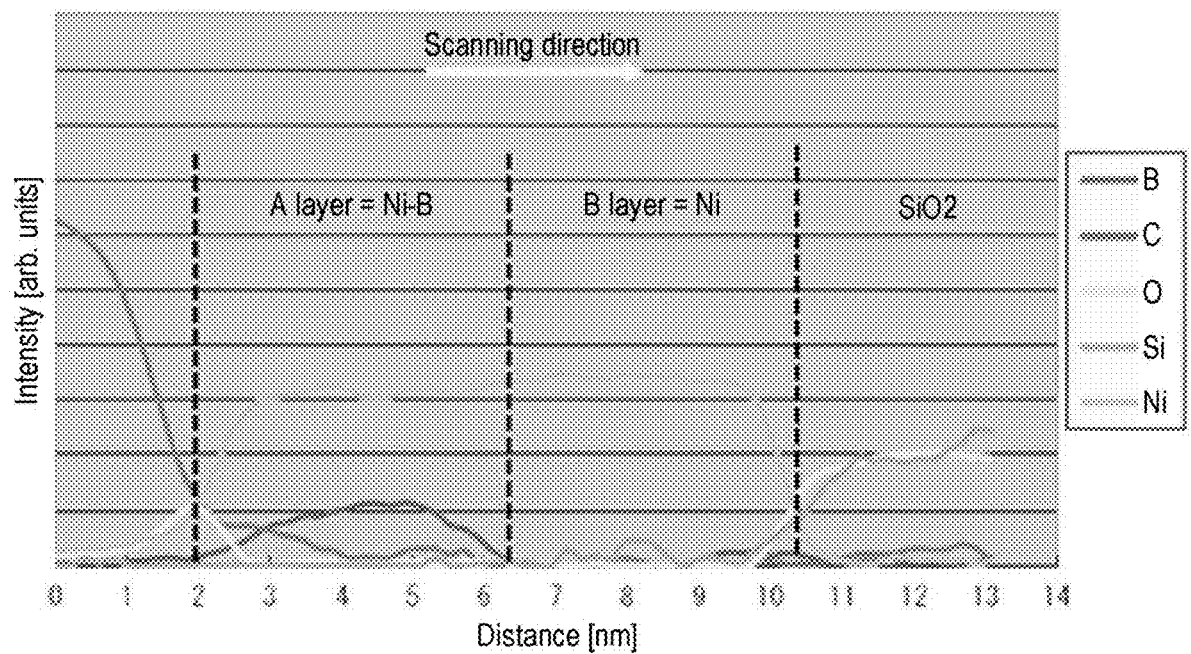

FIGS. 8A and 8B show the results of analysis on elements contained in the Ni film by TEM (Transmission Electron Microscope)-EELS (Electron Energy-Loss Spectroscopy). It can be seen from FIGS. 8A and 8B that, along a scanning direction shown in FIG. 8A, a Ni—B layer (A layer) containing B is formed at a depth of about 2 to 6.3 nm from the surface of the Ni film, a Ni layer (B layer) containing substantially no B is formed at a depth of about 6.3 to 10.4 nm, and a deeper SiO layer ($SiO_2$ layer) also contains substantially no B, as shown in FIG. 8B. In the A layer, B is particularly remarkably added up to a depth of about 4 to 5 nm.

Figure 9:
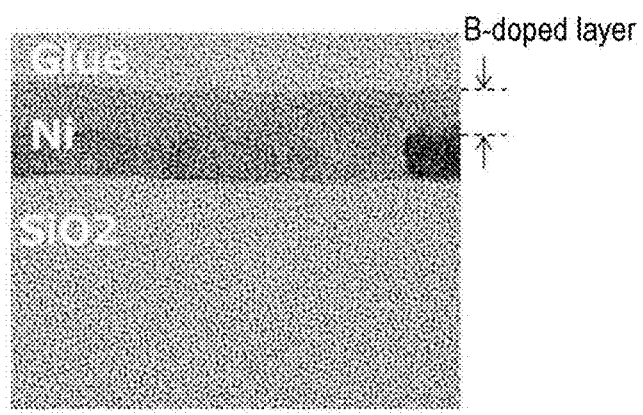
FIG. 9 is a sectional TEM image of a Ni film according to the first embodiments of the present disclosure.

It can also be seen from a TEM image of the section of the Ni film shown in FIG. 9 that the Ni film is divided into two upper and lower layers. In the Ni film, crystal grains are observed in the lower layer to which B is not added, whereas crystal grains disappear in the upper layer to which B is added. It is, therefore, confirmed that the crystallinity of the Ni film is changed by the addition of B.

One of the reasons why the Ni film is annealed in a later step to form NiSi may be to put Si into the Ni film to form NiSi in order to eliminate a Schottky junction (since electric conduction occurs via a trap, the Schottky junction is eliminated). At this time, by previously putting B into the Ni film, the impurity concentration in NiSi may increase to thereby increase the ohmic conduction. That is, it is as if the work function has disappeared.

(3) Effects According to the Present Embodiments

According to the present embodiments, one or more effects set forth below may be achieved.

(a) By supplying a B-containing gas to a substrate in which a Ni film and a film other than the Ni film are formed on a film in which B is doped (B-doped Si film), at a temperature that does not cause self-decomposition, the Ni film can be selectively doped with B without using a mask.

(b) By supplying the B-containing gas in pulses, the uniformity of amount of B added to the Ni film can be improved.

(c) By doping the Ni film with B, the crystallinity of the Ni film is changed so that the Ni film can have a crystalline structure having a property of improving etching resistance.

(d) By previously doping the Ni film with B, the impurity concentration in NiSi (that is, B-doped NiSi) formed in a later step can be increased so that the ohmic conduction can be increased.

Second Embodiments of the Present Disclosure

Next, second embodiments of the present disclosure will be described. Parts different from the first embodiments will be mainly described, and explanation about the same parts as in the first embodiments will be omitted. The second embodiments are different from the first embodiments in that the $B_2H_6$-gas-supplying step is performed only once (n=1). That is, the $B_2H_6$ gas is supplied not in pulses but continuously (continuous supply).

According to the second embodiments, one or more of the above-described effects can be achieved, and the following effects can further be achieved.

(e) The processing time can be reduced by continuously supplying the $B_2H_6$ gas (throughput improvement).

Third Embodiments of the Present Disclosure

Next, third embodiments of the present disclosure will be described. Parts different from the first embodiments will be mainly described, and explanation about the same parts as in the first embodiments will be omitted. Two types of gases are used as the B-containing gas. For example, a $B_2H_6$ gas (first dopant-containing gas) and a $BCl_3$ gas (second dopant gas) are used as the B-containing gas. A $BCl_3$-gas-supplying step of supplying the $BCl_3$ gas to the wafer 200 is first performed in the same procedure as the $B_2H_6$-gas-supplying step of the first embodiments, a residual-gas-removing step is performed in the same procedure as in the first embodiments, and the $B_2H_6$-gas-supplying step and the residual-gas-removing step are then performed in the same procedure as in the first embodiments. This cycle is performed n times. That is, the $BCl_3$ gas and the $B_2H_6$ gas are alternately supplied to the wafer 200 so as not to be mixed with each other (alternate supply).

According to the third embodiments, one or more of the above-described effects can be achieved, and the following effects can further be achieved.

(f) By alternately supplying the $BCl_3$ gas and the $B_2H_6$ gas, mutual ligands bonded to B penetrated into the Ni film can react with each other, thereby suppressing unintended impurities (Cl and H) from leaving in the Ni film. That is, Cl in the $BCl_3$ gas reacts with H in the $B_2H_6$ gas to form HCl, which is removed from the Ni film, preferentially leaving B in the Ni film.

(g) By flowing the $BCl_3$ gas before the $B_2H_6$ gas, it is possible to prevent HCl formed by the reaction of the mutual ligands from being introduced into the Ni film.

An example in which B is added after the Ni film is formed has been described above. However, the present disclosure is not limited thereto. For example, a B-doped Ni film may be formed by alternately repeating the formation of the Ni film and the addition of B. By forming the B-doped Ni film by alternately repeating the formation of the Ni film and the addition of B, the uniformity of amount of B added to the Ni film can be improved. In this case, the formation of the Ni film and the addition of B may be performed in the same process chamber (in-situ).

Further, in the above description, a double-tube reaction vessel including the outer tube 203 and the inner tube 204 is used as the reaction vessel of the substrate processing apparatus. However, the present disclosure is not limited thereto. For example, a single-tube reaction vessel including only one tube may be used.

Further, an example in which the $B_2H_6$ gas or the $BCl_3$ gas is used as the B-containing gas has been described above. However, the present disclosure is not limited thereto. For example, diborane, boron trichloride, triethylboron, trisdimethylaminoboron, trisdiethylaminoboron, triethoxyboron, trimethoxyboron, or the like may be used as the B-containing gas.

Further, an example in which the Ni film is used as a film to be preferentially selectively doped has been described above. However, the present disclosure is not limited thereto. For example, a metal film such as a cobalt (Co) film, or a silicon (Si) film may be used as the film to be preferentially selectively doped.

Further, an example in which the SiN film or the SiO film is used as a film (non-selectively doped film) different from the film to be selectively doped has been described above. However, the present disclosure is not limited thereto. For example, a silicon film, a tantalum film (Ta film), a tantalum nitride film (TaN film), a titanium film (Ti film), a titanium nitride film (TiN film), a tungsten film (W film), or the like may be used as the non-selectively doped film.

Furthermore, an example in which the present disclosure is used for an electrode of a MOSFET has been described in the above-described experimental example. However, the present disclosure is not limited thereto. For example, the present disclosure can be applied to a source, a drain, or the like of the MOSFET.

While various typical embodiments and examples of the present disclosure have been described above, the present disclosure is not limited to these embodiments and examples, but may be used in proper combinations thereof.

INDUSTRIAL APPLICABILITY

According to the present disclosure, it is possible to suppress diffusion of impurities from a silicon film doped with the impurities to a metal film formed on the silicon film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   selectively doping a metal film with a dopant by performing:
   supplying a dopant-containing gas containing the dopant to the substrate that includes:
   a base film with the dopant doped; and
   the metal film and a film other than the metal film that are formed on the base film; and
   removing the dopant-containing gas from above the substrate,
   wherein the metal film acts as a catalyst that decomposes the dopant-containing gas to thereby diffuse the dopant from the decomposed dopant-containing gas into only the metal film and not the film other than the metal film, and the film other than the metal film does not act as the catalyst.

2. The method according to claim 1, wherein the dopant is boron.

3. The method according to claim 2, wherein the dopant-containing gas is diborane, boron trichloride, triethylboron, trisdimethylaminoboron, trisdiethylaminoboron, triethoxyboron, or trimethoxyboron.

4. The method according to claim 1, wherein the metal film is a nickel film.

5. The method according to claim 1, wherein the film other than the metal film is a silicon film, a silicon oxide film, a silicon nitride film, a tantalum film, a tantalum nitride film, a titanium film, a titanium nitride film, or a tungsten film.

6. The method according to claim 1, wherein the act of supplying the dopant-containing gas and the act of removing the dopant-containing gas are alternately repeated multiple times.

7. The method according to claim 6, wherein the dopant-containing gas is diborane.

8. The method according to claim 1, wherein the act of supplying the dopant-containing gas and the act of removing the dopant-containing gas are each performed once.

9. A method of processing a substrate, comprising:
selectively doping a metal film with a dopant by sequentially repeating, multiple times:
supplying a first dopant-containing gas containing the dopant to the substrate that includes:
a base film with the dopant doped; and
the metal film and a film other than the metal film that are formed on the base film;
removing the first dopant-containing gas from above the substrate;
supplying a second dopant-containing gas containing the dopant to above the substrate; and
removing the second dopant-containing gas from above the substrate,
wherein the metal film acts as a catalyst that decomposes at least one selected from the group of the first dopant-containing gas and the second dopant-containing gas to thereby diffuse the dopant from the decomposed dopant-containing gas into only the metal film and not the film other than the metal film, and the film other than the metal film does not act as the catalyst.

10. The method according to claim 9, wherein the dopant is boron, one of the first dopant-containing gas and the second dopant-containing gas is diborane, and the other of the first dopant-containing gas and the second dopant-containing gas is boron trichloride.

11. A substrate processing apparatus comprising:
a process chamber that accommodates a substrate;
a gas supply system configured to supply a dopant-containing gas containing a dopant to the substrate in the process chamber;
an exhaust system configured to exhaust an interior of the process chamber; and
a controller configured to control the gas supply system and the exhaust system so as to perform a process including:
selectively doping a metal film with the dopant by performing:
supplying the dopant-containing gas to the substrate, which is accommodated in the process chamber, and includes:
a base film with the dopant doped; and
the metal film and a film other than the metal film that are formed on the base film; and
exhausting the dopant-containing gas from the process chamber,
wherein the metal film acts as a catalyst that decomposes the dopant-containing gas to thereby diffuse the dopant from the decomposed dopant-containing gas into only the metal film and not the film other than the metal film, and the film other than the metal film does not act as the catalyst.

12. A substrate processing apparatus comprising:
a process chamber that accommodates a substrate;
a gas supply system configured to supply a first dopant-containing gas containing a dopant and a second dopant-containing gas, which is different from the first dopant-containing gas, containing the dopant to the substrate in the process chamber;
an exhaust system configured to exhaust an interior of the process chamber; and
a controller configured to control the gas supply system and the exhaust system so as to perform a process including:
selectively doping a metal film with the dopant by sequentially repeating, multiple times:
supplying the first dopant-containing gas to the substrate, which is accommodated in the process chamber, and includes:
a base film with the dopant doped; and
the metal film and a film other than the metal film that are formed on the base film;
exhausting the first dopant-containing gas from the process chamber;
supplying the second dopant-containing gas to the substrate which is accommodated in the process chamber; and
exhausting the second dopant-containing gas from the process chamber,
wherein the metal film acts as a catalyst that decomposes at least one selected from the group of the first dopant-containing gas and the second dopant-containing gas to thereby diffuse the dopant from the decomposed dopant-containing gas into only the metal film and not the film other than the metal film, and the film other than the metal film does not act as the catalyst.

13. A non-transitory computer-readable recording medium storing a program that causes, by a computer, a substrate processing apparatus to perform a process comprising:
selectively doping a metal film with a dopant by performing:
supplying a dopant-containing gas containing the dopant to a substrate, which is accommodated in a process chamber of the substrate processing apparatus, and includes:
a base film with the dopant doped; and
the metal film and a film other than the metal film that are formed on the base film; and
removing the dopant-containing gas from above the substrate,
wherein the metal film acts as a catalyst that decomposes the dopant-containing gas to thereby diffuse the dopant from the decomposed dopant-containing gas into only the metal film and not the film other than the metal film, and the film other than the metal film does not act as the catalyst.

14. A non-transitory computer-readable recording medium storing a program that causes, by a computer, a substrate processing apparatus to perform a process comprising:

selectively doping a metal film with a dopant by sequentially repeating, multiple times:

supplying a first dopant-containing gas containing the dopant to a substrate, which is accommodated in a process chamber of the substrate processing apparatus, and includes:

a base film with the dopant doped; and the metal film and a film other than the metal film that are formed on the base film;

removing the first dopant-containing gas from above the substrate;

supplying a second dopant-containing gas containing the dopant to above the substrate; and removing the second dopant-containing gas from above the substrate, wherein the metal film acts as a catalyst that decomposes at least one selected from the group of the first dopant-containing gas and the second dopant-containing gas to thereby diffuse the dopant from the decomposed dopant-containing gas into only the metal film and not the film other than the metal film, and the film other than the metal film does not act as the catalyst.

15. A method of manufacturing a semiconductor device, comprising the method of claim 1.

16. A method of manufacturing a semiconductor device, comprising the method of claim 9.

* * * * *